(12) United States Patent
Karavakis et al.

(10) Patent No.: US 9,380,700 B2
(45) Date of Patent: Jun. 28, 2016

(54) METHOD FOR FORMING TRACES OF A PRINTED CIRCUIT BOARD

(71) Applicants: Konstantine Karavakis, Pleasanton, CA (US); Kenneth S. Bahl, Saratoga, CA (US); Steve Carney, San Jose, CA (US)

(72) Inventors: Konstantine Karavakis, Pleasanton, CA (US); Kenneth S. Bahl, Saratoga, CA (US); Steve Carney, San Jose, CA (US)

(73) Assignee: Sierra Circuits, Inc., Sunnyvale, CA (US)

(*) Notice: Subject to any disclaimer, the term of this patent is extended or adjusted under 35 U.S.C. 154(b) by 106 days.

(21) Appl. No.: 14/281,631

(22) Filed: May 19, 2014

(65) Prior Publication Data
US 2015/0334826 A1 Nov. 19, 2015

(51) Int. Cl.
| | |
|---|---|
| H05K 3/02 | (2006.01) |
| H05K 3/10 | (2006.01) |
| H05K 1/03 | (2006.01) |
| H05K 1/09 | (2006.01) |
| H05K 1/11 | (2006.01) |
| H05K 3/08 | (2006.01) |
| H05K 3/40 | (2006.01) |

(Continued)

(52) U.S. Cl.
CPC ............ *H05K 1/0306* (2013.01); *H05K 1/09* (2013.01); *H05K 1/115* (2013.01); *H05K 3/08* (2013.01); *H05K 3/185* (2013.01); *H05K 3/4038* (2013.01); *H05K 3/0041* (2013.01); *H05K 3/107* (2013.01); *H05K 2201/017* (2013.01); *H05K 2201/0236* (2013.01); *H05K 2201/0376* (2013.01); *H05K 2203/025* (2013.01); *H05K 2203/0716* (2013.01); *H05K 2203/107* (2013.01)

(58) Field of Classification Search
CPC ....... H05K 3/107; H05K 3/184; H05K 3/045; H05K 1/0373; H05K 3/181; H05K 3/185; H05K 2201/0236; H05K 2203/107; H05K 1/0306; H05K 1/09; H05K 1/15; H05K 3/08; H05K 3/4038; H05K 2201/017; H05K 2201/0376; H05K 2203/025; H05K 2203/0716; H05K 3/0041; G03F 7/002; Y10T 29/49126; Y10T 29/49155; Y10T 29/49165
USPC ............. 29/830, 846, 852; 174/262; 257/698, 257/774; 427/98.5, 99.1, 302; 438/637, 678
See application file for complete search history.

(56) References Cited

U.S. PATENT DOCUMENTS

| | | |
|---|---|---|
| 3,259,559 A | 7/1966 | John et al. |
| 3,546,009 A | 12/1970 | Schneble, Jr. et al. |

(Continued)

FOREIGN PATENT DOCUMENTS

| | | |
|---|---|---|
| EP | 1367872 A2 | 12/2003 |
| EP | 2420593 A1 | 2/2012 |

(Continued)

OTHER PUBLICATIONS

International Search Report and Written Opinion of the International Searching Authority for related application PCT/US2015/014619 mailed on Jun. 5, 2015.

(Continued)

*Primary Examiner* — Donghai D Nguyen
(74) *Attorney, Agent, or Firm* — Douglas L. Weller

(57) ABSTRACT

A printed circuit board includes a laminate substrate. The laminate substrate includes catalytic material that resists metal plating except where a surface of the catalytic material is ablated. Metal traces are formed within in trace channels within the laminate substrate. The channels extend below the surface of the catalytic material.

19 Claims, 4 Drawing Sheets

(51) Int. Cl.
*H05K 3/18* (2006.01)
*H05K 3/00* (2006.01)

(56) References Cited

U.S. PATENT DOCUMENTS

| | | | |
|---|---|---|---|
| 4,287,253 A | | 9/1981 | Leech |
| 4,859,571 A | * | 8/1989 | Cohen .................. G03F 7/0047 427/302 |
| 5,162,144 A | | 11/1992 | Brown et al. |
| 5,260,170 A | * | 11/1993 | Brown .................... G03F 7/002 427/99.1 |
| 5,272,600 A | | 12/1993 | Carey |
| 5,340,746 A | | 8/1994 | Hagen et al. |
| 5,470,532 A | | 11/1995 | Hagen et al. |
| 6,452,278 B1 | | 9/2002 | DiCaprio et al. |
| 7,271,099 B2 | | 9/2007 | Bromley et al. |
| 7,334,326 B1 | | 2/2008 | Huemoeller et al. |
| 7,632,753 B1 | * | 12/2009 | Rusli ................. H01L 21/76804 438/678 |
| 7,752,752 B1 | * | 7/2010 | Rusli ...................... H05K 3/045 29/852 |
| 8,059,415 B2 | | 11/2011 | Nelson et al. |
| 8,158,267 B2 | | 4/2012 | Tacken et al. |
| 8,648,277 B2 | | 2/2014 | Alpay et al. |
| 2004/0224252 A1 | | 11/2004 | Kondo et al. |
| 2006/0055021 A1 | | 3/2006 | Yamamoto |
| 2006/0057341 A1 | | 3/2006 | Kawabata et al. |
| 2006/0068173 A1 | | 3/2006 | Kajiyama et al. |
| 2007/0014975 A1 | | 1/2007 | Ota |
| 2009/0120660 A1 | | 5/2009 | Park et al. |
| 2010/0266752 A1 | | 10/2010 | Tseng et al. |
| 2011/0048783 A1 | | 3/2011 | Yu |
| 2012/0074094 A1 | | 3/2012 | Chiang et al. |
| 2013/0043062 A1 | | 2/2013 | Wisman |

FOREIGN PATENT DOCUMENTS

| | | |
|---|---|---|
| EP | 2584064 A2 | 4/2013 |
| WO | 2009006010 A2 | 1/2009 |
| WO | 2012127205 A1 | 9/2012 |

OTHER PUBLICATIONS

International Search Report and Written Opinion of the International Searching Authority for related application PCT/US2015/014599 mailed on May 28, 2015.

M-CAM International, LLC., Sierra Circuits Innovation Data Analysis, Appendix C—Selected Art of Interest for U.S. Appl. No. 14/281,631 and Continuation, 2015.

* cited by examiner

METHOD FOR FORMING TRACES OF A PRINTED CIRCUIT BOARD

BACKGROUND

In a typical printed circuit board (PCB) fabrication process, copper clad laminate with copper on both sides of the PCB can be used. A photoimagable resist is applied on both sides of the PCB and exposed and developed to create the circuitry. The unwanted copper between the circuitry is then removed using copper chemical etching solutions. The resist is then chemically removed. For multilayer constructions, glass reinforced not fully cured resin prepregs can be placed on both sides of a finished core and laminated under heat, vacuum and pressure using copper foil on both sides of the PCB. Hole formation can be performed using mechanical means such as drilling or lasers to create blind vias to interconnect the outer layers to the inner ones. Prepregs, if not already impregnated with a synthetic resin, can be reinforced with a synthetic resin.

DESCRIPTION OF THE EMBODIMENT

In printed circuit board (PCB) fabrication where traces are formed above a laminate surface by 0.5-2.5 mils, there is a potential that voids can be entrapped between the traces during a prepreg lamination or during a solder mask application if the PCB is a two-layer board. In addition, signal integrity and conductor impedance are functions of the dielectric spacing between traces. When PCB traces are formed above a laminate surface, dielectric space above the PCB traces will vary across the length and width of the board. This makes it difficult to accurately control impedance of the PCB traces. Also, when PCB traces are formed above a laminate surface and trace widths and spaces are less than one mil, failures of fine trace lines to properly adhere to the laminate surface can cause both poor yields in fabrication and reliability issues. For example, when forming traces on the substrate surface, the geometry of the traces can vary across the length of the traces due to inaccuracies introduced by the limitations of photolithography and chemical copper etching. Varying geometries of traces can create poor signal propagation and trace impedance.

Figure 1:
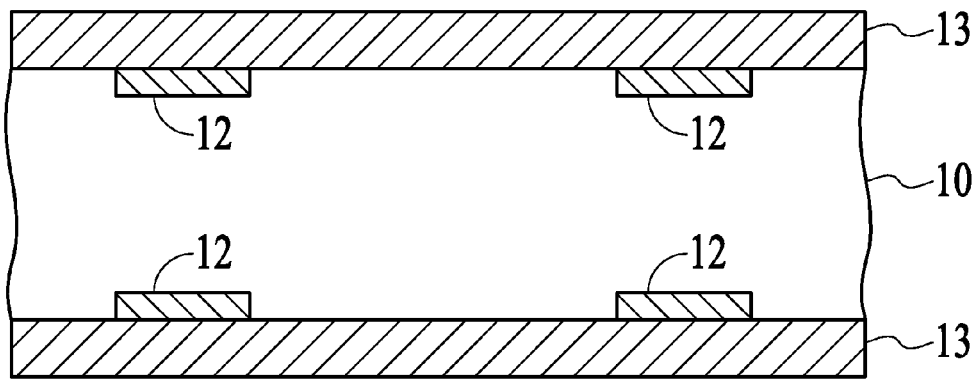
FIG. 1 shows a simplified diagram illustrated a printed circuit board structure with embedded traces in accordance with an implementation.
Figure 2:
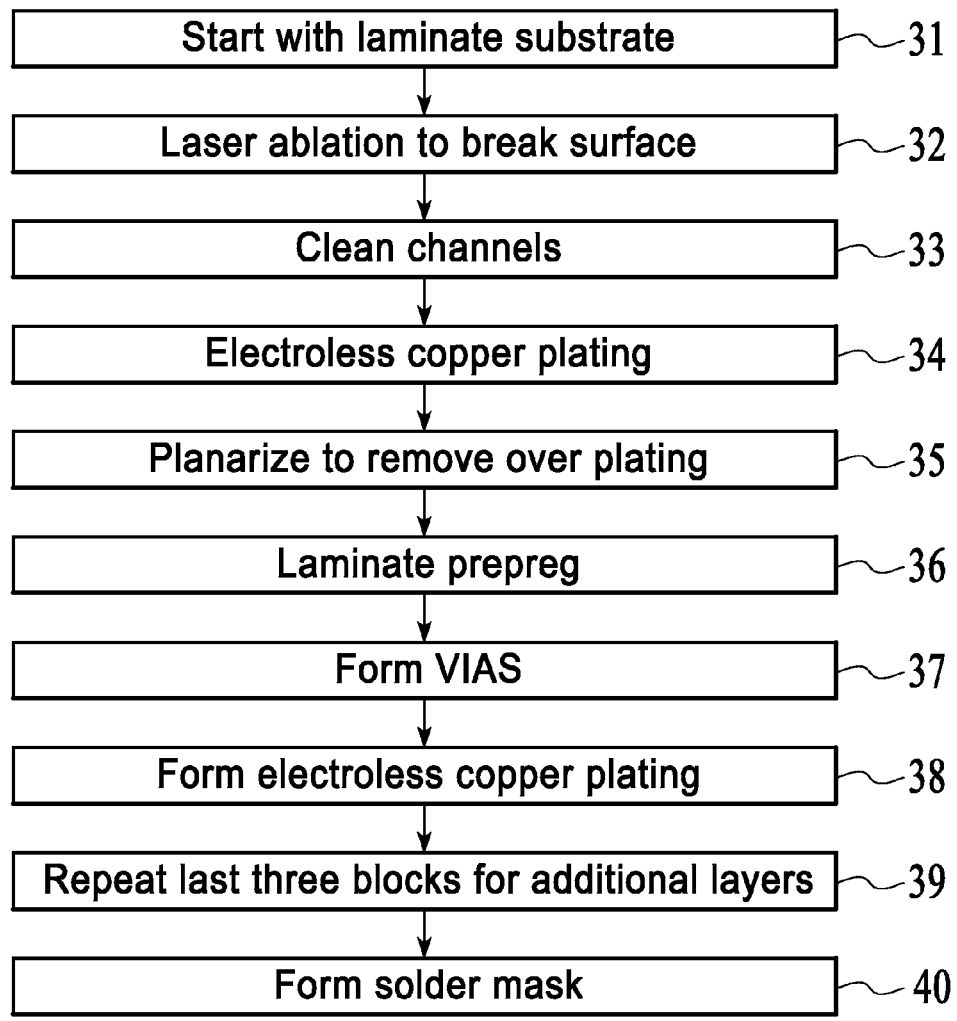
FIG. 2 sets out a simplified flowchart that summarizes a process for fabricating a printed circuit board with embedded traces in accordance with an implementation.
Figure 3:
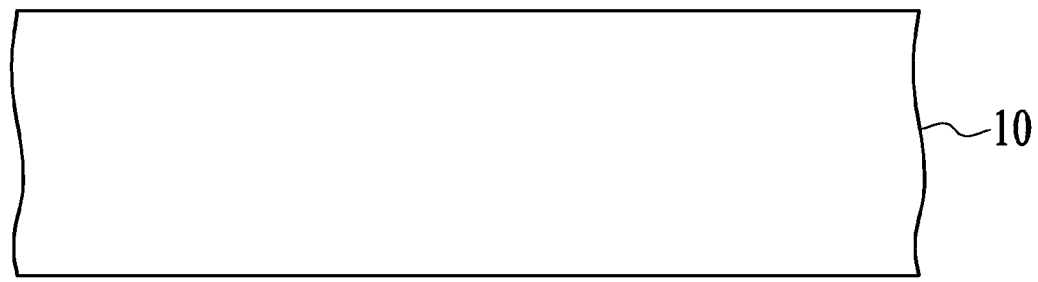
FIG. 3, FIG. 4, FIG. 5, FIG. 6, FIG. 7, FIG. 8, FIG. 9 and FIG. 10 illustrate steps in a process for fabricating a printed circuit board with embedded traces in accordance with an implementation.

In order to solve the above issues that arise when PCB traces are formed above a laminate surface, PCB traces are embedded in a laminate substrate so that the PCB traces do not extend above the laminate surface. This is illustrated in FIG. 2 where PCB traces 12 are embedded within a laminate substrate 10. A next layer 13 can be, for example, a solder mask for a two-layer PCB board, or a prepreg lamination layer for a PCB board that includes more than two-layers or a non-glass reinforced catalytic adhesive.

PCB traces 12 are formed in channels with a depth, for example, between 0.25 and 2.5 mils. The channels are ablated in the surface of laminate substrate 10. Embedding PCB traces 12 provides for better electrical performance since the geometry of the PCB traces is very well controlled by the channel formation process. Also, embedding PCB traces 12 in laminate substrate 10 solves the adhesion problem that arises when traces are very fine, for example, when trace thickness and space between traces is less than one mil. When PCB traces are embedded they are constrained on three sides by laminate surfaces.

FIG. 2 sets out a simplified flowchart that summarizes a process for fabricating a printed circuit board with embedded traces. In a block 31, the process starts with a laminate substrate. For example, a catalytic base laminate is used without any copper. For example, the catalytic base laminate uses palladium powder that includes palladium catalytic particles made out of inorganic fillers primarily Kaolin. For example, the inorganic fillers are produced by contacting a salt palladium, at the surface of a filler such as aluminum silicate, and clays such as Kaolin with a reducing agent. Alternatively, instead of salt of palladium, salt of another metal such as silver can be used.

Hydrazine hydrate can be used as a reducing agent to reduce the palladium salt to palladium metal. The filler can be added into a mixing tank with water in a form of slurry and then a palladium chlorine (PdCl) and hydrochloric acid (HCl) solution added into the mixture followed by the hydrazine hydrate. For more information on making such a catalytic power, see U.S. Pat. No. 4,287,253.

The catalytic powder can be dispersed in an epoxy resin well. The epoxy resin with the catalytic filler in it can be used to impregnate a glass cloth with resin and catalyst using conventional glass cloth coating and drying equipment. The coated semi-cured resin/glass cloths can be used to make laminates for printed circuit boards by pressing the coated semi-cured resin/glass cloths together under standard vacuum laminating equipment. The resulting layered laminate material can be used as a catalytic laminate substrate for a printed circuit board.

For example, laminate substrate 10 is a catalytic laminate substrate of any thickness between, for example, two and sixty mils. For example, laminate substrate 10 is composed of a non-clad catalytic base laminate with outside prepregs that are resin rich so that after vacuum lamination the resulting finished laminate has a resin rich surface. For example, resin rich prepregs can have (but are not limited to) a glass style 106 with 71% resin content or a glass style 1035 with 65% resin content. Using a resin rich laminate surface assures that when channels are made, primarily resin is removed and not glass. This can speed up the channel formation process and improve the quality of the channel. For example, the surface of the resin rich catalytic laminate is initially protected with a release film so that the surface is protected from scratches as scratches will plate up copper and create defects. When ready for channel formation, the release film is removed from both sides of laminate substrate 10.

Figure 4:
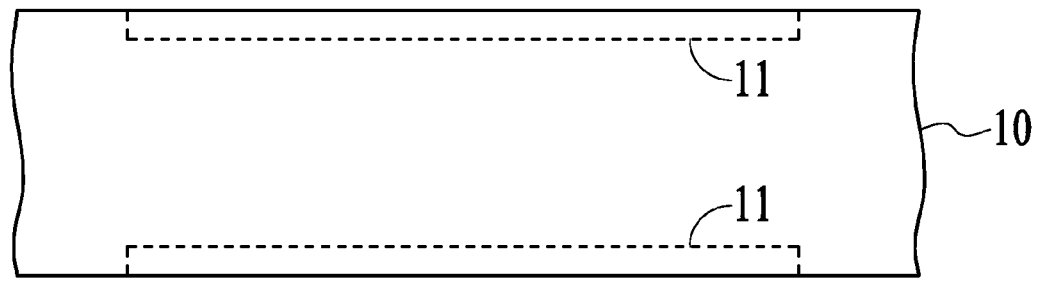

In a block 32, laser ablation is used to break the surface of laminate substrate 10 and form channels 11, as shown in FIG. 4. The laser ablation can be accomplished, for example, with an ultraviolet (UV) excimer laser, with a Yttrium aluminum garnet (YAG) laser, with a UV YAG laser or with some other type of laser, or alternatively, a non-laser ablation process. Excimer laser ablation creates good depth control and channel resolution.

As an alternative to using laser ablation to form channels, resist can be applied on both sides of laminate substrate 10. The resist is exposed and developed to delineate locations of the channels. For example, resist thickness is thicker than the depth of the channels. For example, for a channel depth of 0.5 mils, resist thickness can be 1.0 to 1.5 mils. The formation of the channels can then be performed using plasma etching with a combination of gasses (e.g., O2, CF4, Ar, etc.) along with the proper power and duration. It is expected the channel will be etched at a different rate than the resist. For example, the resist thickness should be sufficiently thicker that the channel depth so that when the channel depth is reached there is some resist left protecting unexposed regions of the surfaces of laminate substrate 10. After plasma etching, the remaining resist can be removed by a resist stripper.

Alternatively, instead of protecting the surface of laminate substrate with resist when performing plasma etch, other protective material can be used. For example, the protection can be accomplished using a foil, such as a copper foil or aluminum foil, that gets applied to laminate substrate 10. The shiny side of the foil can be placed facing laminate substrate 10 so the foil can be peeled off after channel formation. For example, after applying the foil to laminate substrate 10, resist will be applied over the foil. The resist is exposed/develop to expose the foil over the channel regions. The foil is etched to expose the channel regions in laminate substrate 10. The remaining resist is then stripped and the channels are plasma etched. The remaining foil is peeled off and processing continues.

Alternatively, channels can be formed using high pressure water cutting. The high pressure water cutting can be performed using programmable high pressure water cutting machines such as those used for cutting hard materials such as steel and stainless steel. Another mechanical processes such as drilling and routing can be used for making the channels.

In a block 33, the laminate substrate is cleaned to remove debris from channels 11. For example, the cleaning can be accomplished by an ultrasonic rinse using acoustic wave with a frequency within the range of 40 to 160 megahertz (MHz). A more aggressive chemical cleaning is typically not used as an aggressive chemical cleaning may result in the surface of laminate substrate 10 being roughened or etched. If the surface of laminate substrate 10 is etched this can result in metal plating at locations not within formed channels.

Figure 5:
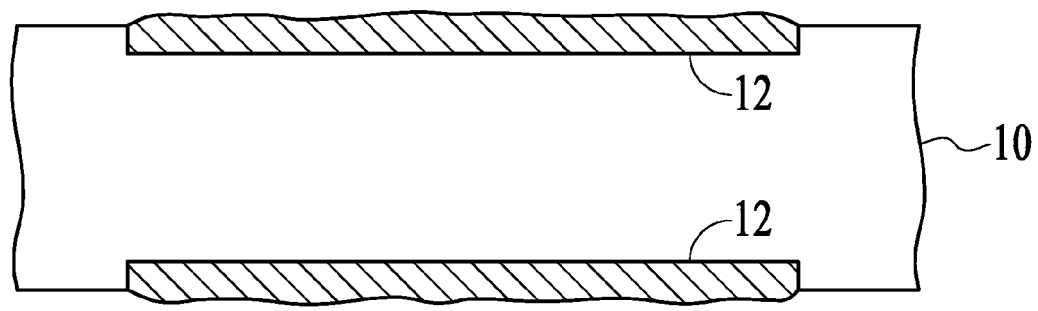
Figure 6:
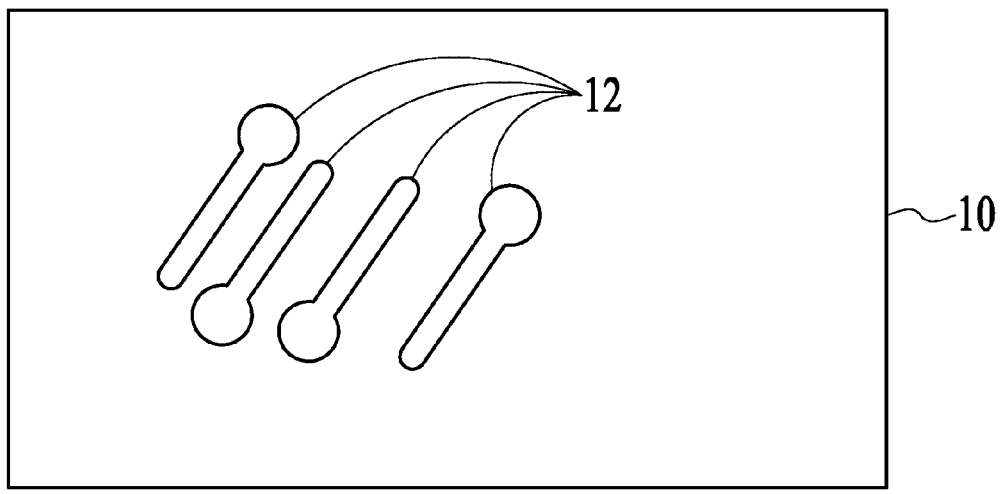

In a block 34, traces 12 are formed in channels 11, as illustrated by FIG. 5. For example, traces 12 are a metal such as copper. For example, to form copper traces, laminate substrate 10 is immersed into a fast electroless copper bath. Channels 11 are plated all the way up and slightly above the surface of laminate substrate 10. The electroless copper bath plates only on the exposed catalytic areas that were exposed by the ablation process. No copper plates outside channels 11 since during the lamination process of making laminate substrate 10 the copper catalyzes only at locations where the surface of the laminate substrate 10 where the surface is ablated, scratched or roughened. As a result copper traces form where ablation has penetrated the surface of laminate substrate 10. A simplified top view of traces within laminate substrate 10 is shown in FIG. 6.

Figure 7:
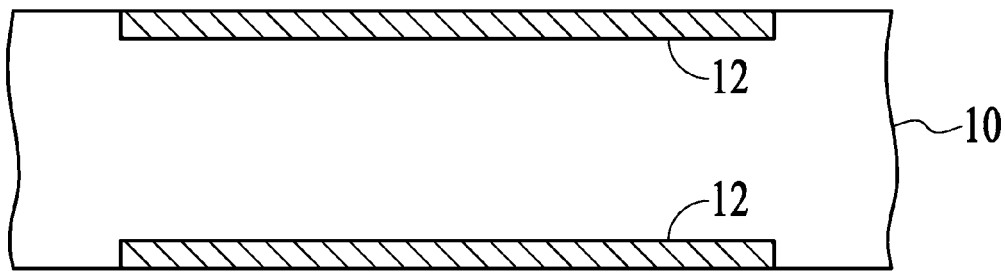

In a block 35, the surfaces of laminate substrate 10 are planarized, for example, using fine grid sandpaper (e.g., 420 grit to 1200 grit). The planarization removes any excess copper that extends above the channels. For example, a planarization machine such as those produced by MASS, Inc., can be used. The resulting planarization is illustrated in FIG. 7. For a two-layer PCB board, a solder mask is applied. For example, the PCB may be finished by performing selective gold plating followed by singulation and inspection.

Figure 8:
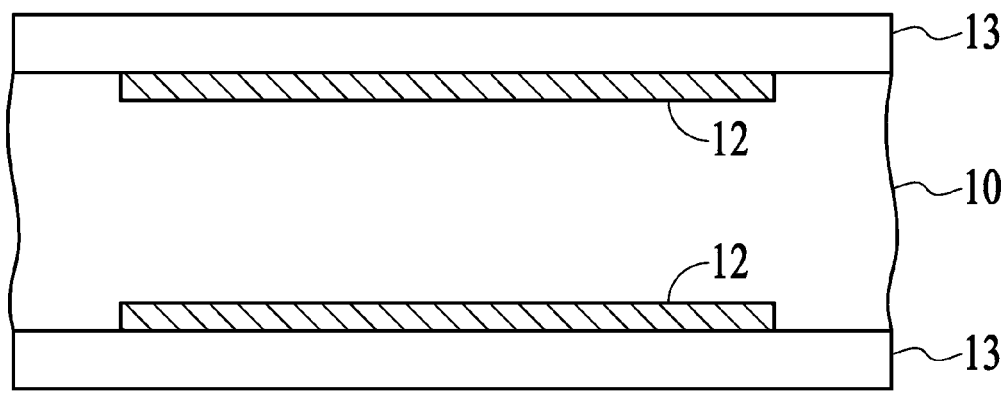

When the PCB board will have more than two layers, in a block 36, a resin rich catalytic prepreg material 13 is laminated on both sides of laminate substrate. For example, a release film such as tedlar or Teflon is used. The result is shown in FIG. 8. Alternative to using resin rich catalytic prepreg material 13, a not catalytic material can be used such as a catalytic adhesive material implemented, for example, as a layer of non-glass reinforced catalytic adhesive.

Figure 9:
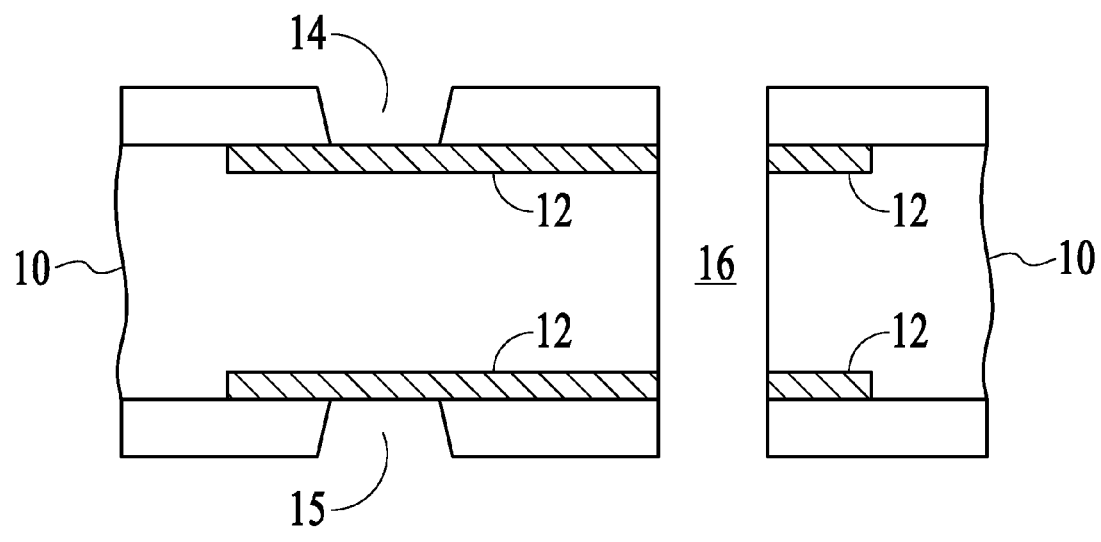

In a block 37, blind and through vias are formed, for example by use of laser or mechanical means such as a drill. The result is illustrated by FIG. 9 where a blind via 14, a blind via 15 and a through via 16 are shown.

Figure 10:
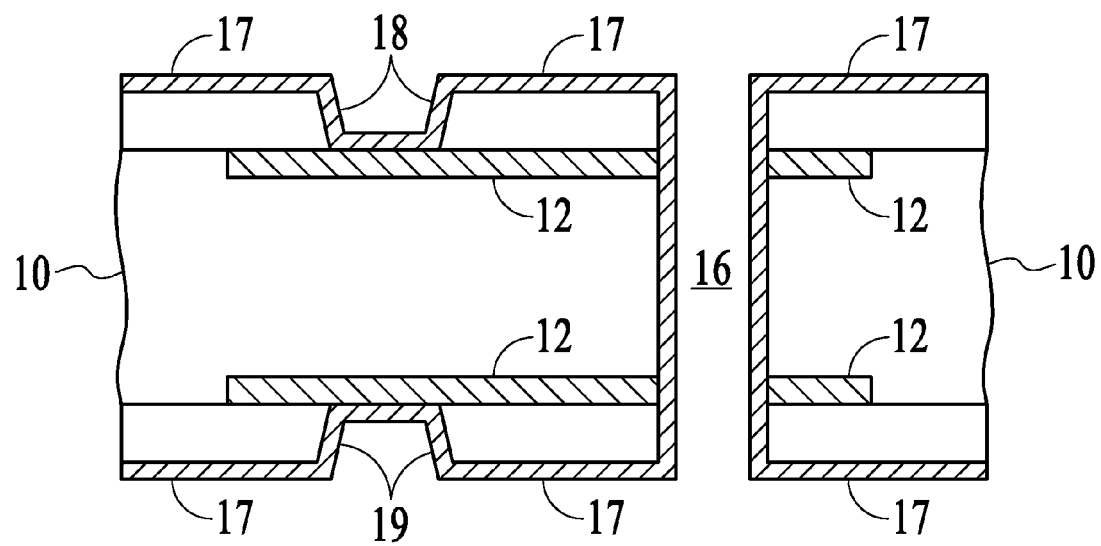

After an ultrasonic cleaning in water, in a block 38, traces 17 are formed. For example traces 17 are a metal, such as copper. For example, traces 17 are formed by electroless copper plating. The electroless copper plating will result in traces being formed within vias 14, 15 and 16, as illustrated by trace regions 18, 19 and 20, respectively. This results in the four layer board structure shown in FIG. 10. For example, the PCB may be finished by performing processing steps such as applying a solder mask, selective gold plating, singulation (i.e., depaneling from an array) and inspection.

Alternatively, in a block 39, additional layers may be added by repeating blocks 36, 37 and 38 as often as necessary to reach the desired numbers of layers. When the desired numbers of layers are reached, in a block 40, the PCB may be finished by performing such processing steps such as applying a solder mask, selective gold plating, singulation (i.e., depaneling PCBs from an array) and inspection.

The foregoing discussion discloses and describes merely exemplary methods and embodiments. As will be understood by those familiar with the art, the disclosed subject matter may be embodied in other specific forms without departing from the spirit or characteristics thereof. Accordingly, the present disclosure is intended to be illustrative, but not limiting, of the scope of the invention, which is set forth in the following claims.

What is claimed is:

1. A method for forming a printed circuit board, comprising:
   forming a printed circuit board laminate substrate from a glass cloth impregnated with resin and catalytic material that is pressed together using vacuum laminating equipment, the printed circuit board laminate substrate having a top surface and having a bottom surface, the catalytic material resisting metal plating except where the top surface is broken and where the bottom surface is broken;
   forming trace channels in the top surface of the printed circuit board laminate substrate and in the bottom surface of the printed circuit board laminate substrate, wherein the channels are formed below the top surface of the printed circuit board laminate substrate and below the bottom surface of the printed circuit board laminate substrate;
   immersing the laminate substrate in a metal bath so that metal plates within the trace channels but not on other portions of the top surface of the printed circuit board laminate substrate and not on other portions of the bottom surface of the printed circuit board laminate substrate;
   planarizing the top surface and the bottom surface so that metal plated within the trace channels is flush with a surface of the laminate substrate; and
   forming at least one through via that extends from the top surface of the printed circuit board laminate substrate to the bottom surface of the printed circuit board laminate substrate.

2. A method as in claim 1 wherein the metal bath is an electroless copper bath.

3. A method as in claim 1 wherein the trace channels are formed using laser ablation.

4. A method as in claim 1 wherein the trace channels are formed by:
applying resist;
exposing and developing the resist to delineate locations of the channels; and,
performing plasma etching to form the channels.

5. A method as in claim 1 wherein the trace channels are formed by:
applying foil;
applying resist over the foil;
exposing and developing the resist to expose portions of the foil that delineate locations of the channels;
etching the exposed portions of the foil; and,
performing plasma etching to form the channels.

6. A method as in claim 1, additionally comprising:
laminating a resin rich catalytic prepreg material on the top surface of the printed circuit board laminate substrate and on the bottom surface of the printed circuit board laminate substrate before forming the at least one through via; and,
forming additional traces on the surface of the resin rich catalytic prepreg material, including forming traces within the at least one through via.

7. A method as in claim 1 wherein the laminate substrate includes palladium catalytic particles.

8. A method as in claim 1 wherein the laminate substrate includes a catalytic powder dispersed in an epoxy resin well.

9. A method as in claim 1 wherein regions of the printed circuit board laminate substrate where the channels are formed are resin rich.

10. A method as in claim 1 wherein the trace channels are formed by one of the following:
high pressure water cutting;
drilling;
routing.

11. A method as in claim 1, wherein the laminate substrate is composed of a non-clad catalytic base laminate with outside prepregs that are resin rich so that after vacuum lamination the resulting finished laminate has a resin rich surface.

12. A method as in claim 1, additionally comprising
protecting the top surface and the bottom surface with a release film before forming the trace channels; and,
removing the release film from the top surface and from the bottom surface in preparation to form the trace channels.

13. A method for forming traces of a printed circuit board, comprising:
forming a laminate substrate from a glass cloth impregnated with resin and catalytic material that is pressed together using vacuum laminating equipment;
forming trace channels in the laminate substrate, wherein the catalytic material resists metal plating except where a surface of the catalytic material is broken, wherein the channels are ablated below the surface of the catalytic material;
performing an electroless copper bath process to place copper traces within the trace channels; and,
planarizing the laminate substrate so that the copper traces are flush with a surface of the laminate substrate.

14. A method as in claim 13 wherein the trace channels are formed by:
applying resist over the laminate substrate;
exposing and developing the resist to delineate locations of the channels; and,
performing plasma etching to form the channels.

15. A method as in claim 13 wherein the trace channels are formed by:
applying foil over the laminate substrate;
applying resist over the foil;
exposing and developing the resist to expose portions of the foil that delineate locations of the channels;
etching the exposed portions of the foil; and,
performing plasma etching to form the channels.

16. A method as in claim 13 wherein the trace channels are formed by one of the following:
laser ablation;
high pressure water cutting;
drilling;
routing.

17. A method as in claim 13, additionally comprising:
laminating a resin rich catalytic prepreg material on the laminate substrate;
forming vias; and,
forming additional traces on the surface of the resin rich catalytic prepreg material, including forming traces within the vias.

18. A method as in claim 13, wherein the laminate substrate is composed of a non-clad catalytic base laminate with outside prepregs that are resin rich so that after vacuum lamination the resulting finished laminate has a resin rich surface.

19. A method as in claim 13, additionally comprising
protecting the laminate substrate with a release film before forming the trace channels; and,
removing the release film from the laminate substrate in preparation to form the trace channels.

* * * * *